United States Patent [19]
Kawasaki et al.

[11] Patent Number: 5,240,558
[45] Date of Patent: Aug. 31, 1993

[54] METHOD FOR FORMING A SEMICONDUCTOR DEVICE

[75] Inventors: Hisao Kawasaki; Umesh Sharma; Howard C. Kirsch, all of Austin, Tex.

[73] Assignee: Motorola, Inc., Schaumburg, Ill.

[21] Appl. No.: 967,294

[22] Filed: Oct. 27, 1992

[51] Int. Cl.$^5$ .................. H01L 21/306; B44C 1/22; C03C 15/00; C23F 1/00
[52] U.S. Cl. .................. 156/659.1; 156/656; 156/657; 156/661.1; 156/662; 156/653; 156/904; 437/52; 437/228; 437/233
[58] Field of Search ........... 156/653, 655, 656, 657, 156/659.1, 661.1, 662, 904; 437/52, 228, 233, 234, 238, 241, 245; 357/23.5, 54

[56] References Cited

U.S. PATENT DOCUMENTS

| | | | |
|---|---|---|---|
| 4,947,221 | 9/1990 | Stewart et al. | 357/23.5 |
| 5,017,505 | 5/1991 | Tetsuo et al. | 437/52 |
| 5,043,780 | 8/1991 | Fazan et al. | 357/23.6 |
| 5,049,517 | 9/1991 | Liu et al. | 437/52 |
| 5,082,797 | 1/1992 | Chan et al. | 437/52 |
| 5,089,867 | 2/1992 | Lee | 357/23.5 |
| 5,110,752 | 5/1992 | Lu | 437/47 |
| 5,134,086 | 7/1992 | Ahn | 437/52 |

OTHER PUBLICATIONS

Yupin Fong et al., "Oxides Grown on Textured Single-Crystal Silicon-Dependence on Process and Application in EEPROM's," IEEE Trans. Electron Devices, vol. 37, No. 3, Mar. 1990, pp. 583-590.

M. Yoshimaru et al., "Rugged Surface Poly-Si Electrode and Low Temperature Deposited Si3N4 for 64 Mbit and Beyond STC DRAM Cell," International Electron Devices Meeting, 1990, pp. 659-662.

J. H. Ahn et al., "Micro Villus Patterning (MVP) Technology for 256Mb DRAM Stack Cell,"1992 Symposium on VLSI Technology Digest of Technical Papers, pp. 12-13.

T. Mine et al., "Capacitance-Enhanced Stacked-Capacitor with Engraved Storage Electrode for Deep Submicon DRAMs," Extended Abstracts of the 21st Conference on Solid State Devices and Materials, 1989, pp. 137-140.

*Primary Examiner*—William A. Powell
*Attorney, Agent, or Firm*—Maurice J. Jones; James L. Clingan, Jr.

[57] ABSTRACT

The surface area of a polysilicon electrode is increased by sputtering non-coalescing islands (20) of aluminum onto a silicon dioxide layer (18), which is overlying the polysilicon electrode. The sputtering process allows uniform island formation to be achieved independent of the deposition surface. The non-coalescing islands are then used as a mask, and a portion of the buffer layer (22) and a portion of the polysilicon electrode (26) are etched to form pillar-like regions (30) within the polysilicon electrode.

19 Claims, 2 Drawing Sheets

METHOD FOR FORMING A SEMICONDUCTOR DEVICE

FIELD OF THE INVENTION

This invention relates generally to semiconductor devices, and more specifically to a process for forming a semiconductor device having increased coupling capacitance.

BACKGROUND OF THE INVENTION

The semiconductor industry's continuing demand for memory devices with ever increasing storage densities has led to a corresponding decrease in memory cell size for each new generation of memory device. Scaling of memory cell size, however, can adversely effect the functionality and reliability of these devices. For example, a reduction in EEPROM, EPROM or Flash EEPROM cell size also decreases the surface area shared by the control gate and floating gate. Therefore, the coupling capacitance between the floating gate and the control gate is reduced, and the probability of inaccurately reading the charge stored in the memory cell increases. Analogously, a reduction in DRAM cell size also leads to a reduction in the surface area shared by the two capacitor electrodes. Thus the capacitance of the DRAM cell is reduced, making it more susceptible to "soft" errors. In addition, lower cell capacitance also adversely effects DRAM noise sensitivity, and refresh rate.

In order to offset the resulting reduction of DRAM cell capacitance, and floating gate to control gate coupling capacitance, with shrinking memory cell size, several solutions have been proposed. The use of texturized or roughened semiconductor electrodes for control gates or capacitor plates is one proposed technique for increasing floating gate to control gate coupling capacitance, and DRAM cell capacitance. One technique for forming these textured semiconductor electrodes is to deposit a silicon dioxide layer over a polysilicon film. Low pressure chemical vapor deposition is then used to deposit polysilicon islands onto the silicon dioxide surface. The exposed portion of the silicon dioxide layer is then anisotropically etched to expose a portion of the polysilicon surface. The exposed portion of the polysilicon surface is then anisotropically etched to form depressions within the polysilicon film. The remaining portion of the silicon dioxide layer is then removed and the textured polysilicon layer is then used to fabricate floating gates and capacitor electrodes.

The process for forming the polysilicon islands, however, has a narrow processing window. The nucleation and growth of a polysilicon island is dependent on deposition temperature. Therefore, temperature gradients across a wafer, as well as temperature variations from wafer to wafer, can lead to uniformity and repeatability problems. In addition, polysilicon island formation is also dependent on the morphology and cleanliness of the underlying deposition surface. Thus variations in surface morphology and surface cleanliness can also lead to non-uniform and non-repeatable polysilicon island formation. Consequently, the texture of the resulting polysilicon films can vary within a wafer and from wafer to wafer. Therefore, the electrical characteristics and performance of a given semiconductor device may vary within the same chip or from chip to chip, and may ultimately result in the fabrication of memory devices that are unreliable and non-functional.

Accordingly, a need exists for a process that uniformly roughens or texturizes the surface of semiconductor electrodes used in semiconductor devices.

SUMMARY OF THE INVENTION

The previously mentioned problems with fabricating semiconductor devices with texturized electrodes are overcome by the present invention. In one form of the invention, a semiconductor device is fabricated by providing a substrate. An electrode layer is then formed overlying the substrate. A plurality of non-coalescing islands of material, which define a trench region, are then sputtered so that they overlie the electrode layer. Using the plurality of non-coalescing islands as a mask, the trench region is then etched to form a plurality of pillar-like regions within the electrode layer. The plurality of non-coalescing islands is then removed.

These and other features, and advantages, will be more clearly understood from the following detailed description taken in conjunction with the accompanying drawings. It is important to point out that the illustrations may not necessarily be drawn to scale, and that there may be other embodiments of the present invention that are not specifically illustrated.

DETAILED DESCRIPTION OF A PREFERRED EMBODIMENT

Figure 1:
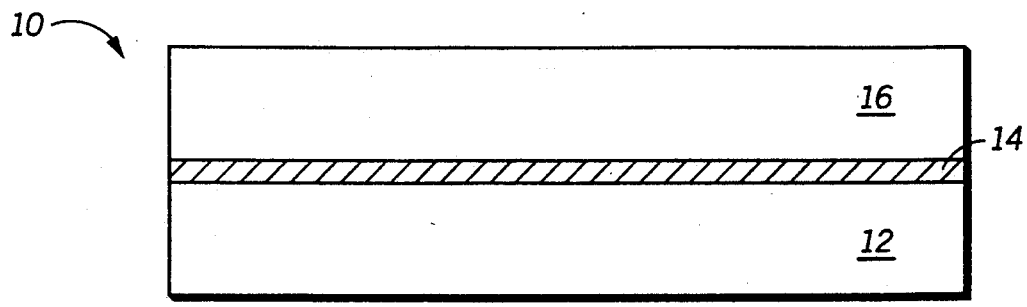
FIGS. 1-8 illustrate, in cross-section, process steps in accordance with one embodiment of the invention, wherein like reference numerals designate identical or corresponding parts throughout the several views.

FIGS. 1 through 8 illustrate, in cross-section, process steps in accordance with one embodiment of the invention wherein a semiconductor device is formed. Shown in FIG. 1 is a portion 10 of an integrated circuit structure comprising a semiconductor substrate 12, a first dielectric layer 14, and an electrode layer 16. Semiconductor substrate 12 is preferably monocrystalline silicon. Alternatively, semiconductor substrate 12 may be any other conventional substrate such as silicon on sapphire, silicon on insulator, or gallium arsenide, et cetera. For EPROM, EEPROM, or Flash EEPROM applications first dielectric layer 14 is preferably a thermally grown silicon dioxide layer. Alternatively, for EPROM, EEPROM or Flash EEPROM applications first dielectric layer 14 may be a stacked silicon dioxide/silicon nitride/silicon dioxide (ONO) dielectric layer or any other conventional gate dielectric layer. For DRAM or SRAM applications dielectric layer 14 is preferably a chemically vapor deposited silicon dioxide layer. Electrode layer 16 is preferably a chemically vapor deposited layer of polysilicon. Alternatively, electrode layer 16 may be another conductive layer such as amorphous silicon, or tungsten, et cetera. Additionally, electrode layer 16 is electrically coupled to a transistor node, in SRAM and DRAM applications, using conventional techniques. The transistor, however, as well as the electrical connection between the transistor node and electrode layer 16, is not shown in order to simplify FIG. 1.

Figure 2:
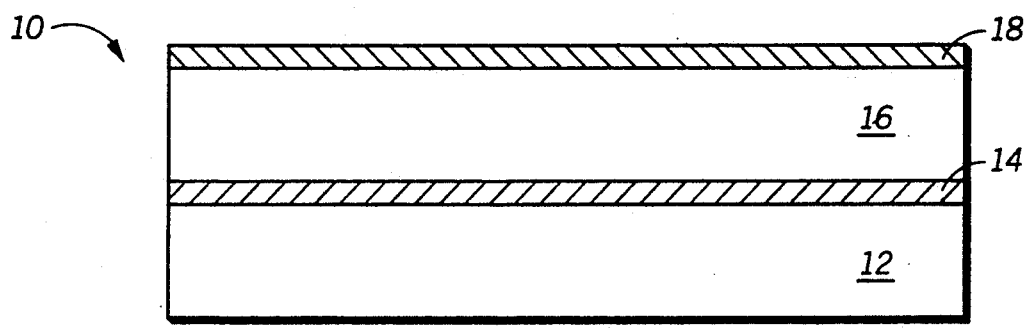

Shown in FIG. 2, the process continues with the formation of a buffer layer 18 overlying electrode layer 16. Buffer layer 18 is preferably a thermally grown layer of silicon dioxide. Alternatively, buffer layer 18 may be chemical vapor deposited silicon dioxide or silicon nitride.

Figure 3:
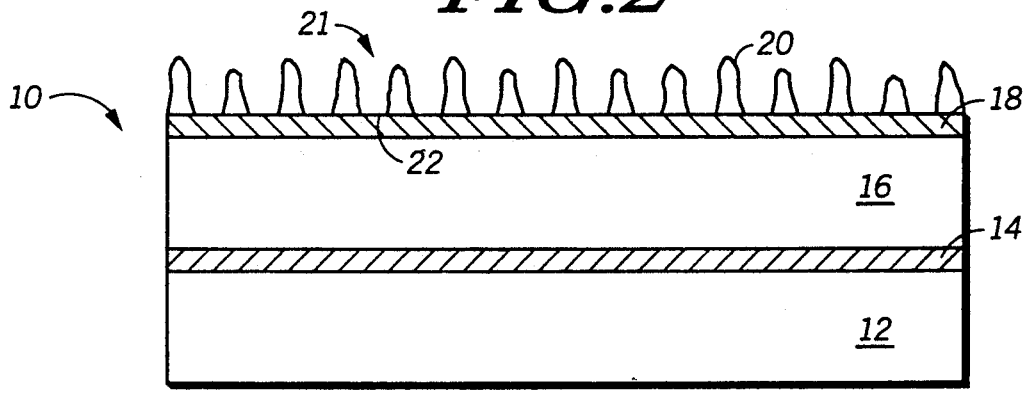

In FIG. 3, a granular film comprising a plurality of non-coalescing islands 20 of material is then sputtered onto buffer layer 18. Non-coalescing islands 20 define a trench region 21 and an exposed portion 22 of buffer layer 18. Although not shown, in FIG. 3, trench region 21 and exposed portion 22 surround the plurality of non-coalescing islands 20. In a preferred embodiment, non-coalescing islands 20 are aluminum and they are formed by sputtering an aluminum target in an argon and nitrogen ambient, wherein the total pressure is approximately 5.0 millitorr, the nitrogen partial pressure is approximately 0.1 millitorr, and the wafer is heated to approximately 300 degrees centigrade. Alternatively, non-coalescing islands 20 may be another sputtered material such as aluminum-silicon, or tungsten, et cetera. Although not illustrated, after the granular film is sputter deposited it may also be etched, using conventional techniques, to increase the density of non-coalescing islands 20. For example, aluminum thickness may vary across a given island. Therefore, areas having a thin aluminum thickness may be etched away to split the original island into two separate islands.

Figure 4:
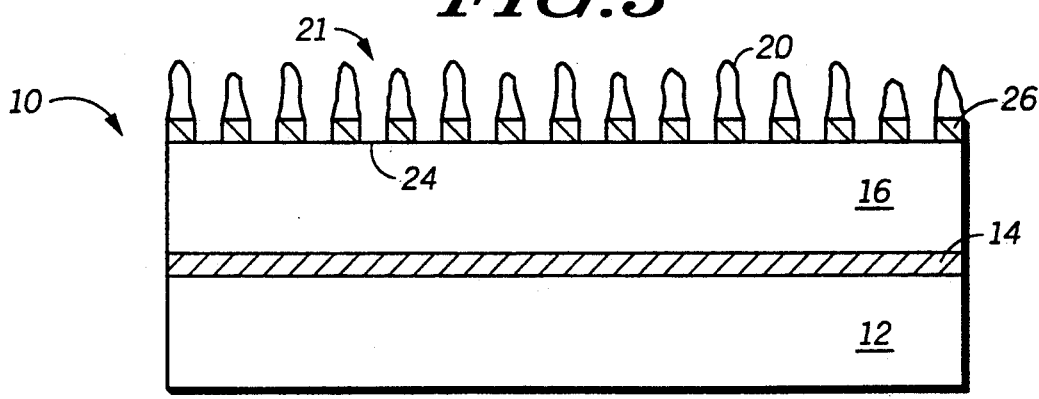

In FIG. 4, non-coalescing islands 20 are used as a mask, while trench region 21 is etched to form an exposed portion 24 of electrode layer 16. As a result, exposed portion 22 of buffer layer 18 is etched, and a remaining portion 26 of buffer layer 18 is formed underneath non-coalescing islands 20, as shown in FIG. 4. Exposed portion 24 is preferably formed using conventional anisotropic etching techniques. Alternatively, exposed portion 24 may also be formed using conventional isotropic etching techniques.

Figure 5:
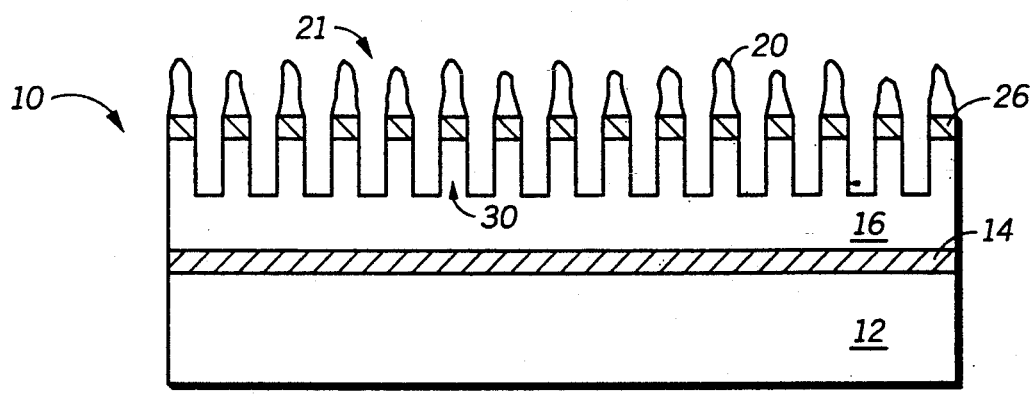

In FIG. 5, exposed portion 24, which underlies trench region 21, is then etched to form a plurality of pillar-like regions 30 within electrode layer 16. Pillar-like regions 30 are preferably formed using conventional anisotropic etching techniques. Alternatively, pillar like-regions 30 may also be formed using conventional isotropic etching techniques.

Figure 6:
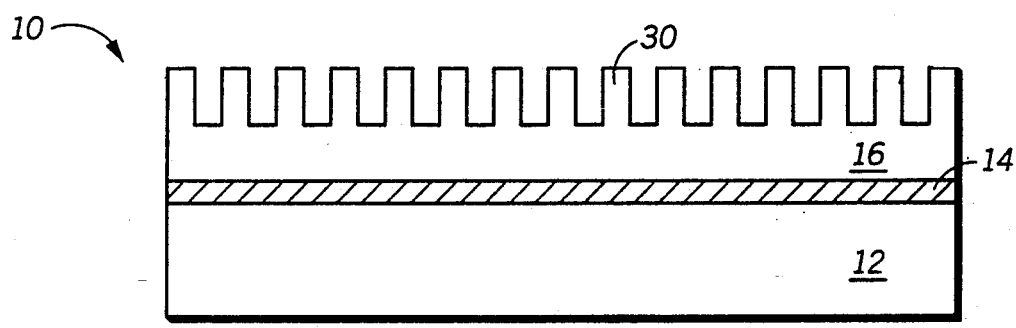

In FIG. 6, non-coalescing islands 20 and remaining portion 26 of buffer layer 18 are then removed using conventional stripping techniques. In accordance with the preferred embodiment, a mixture of hydrogen peroxide and sulfuric acid may be used to remove non-coalescing islands which are comprised of aluminum, and hydrofluoric acid may be used to remove the remaining portion of a silicon dioxide buffer layer.

Figure 7:
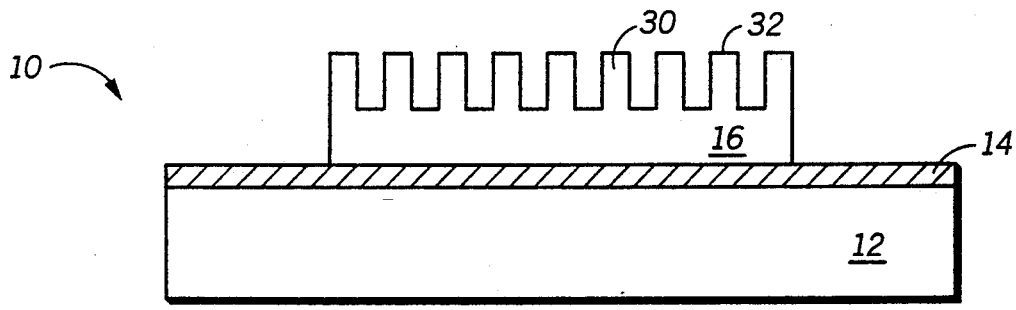

As shown in FIG. 7, electrode layer 16 is then patterned using standard photolithographic patterning and etching techniques. A dielectric layer 32 is then formed overlying pillar-like regions 30. Dielectric layer 32 is preferably an ONO stacked dielectric. Alternatively, dielectric layer 32 may be another conventional dielectric such as titanium dioxide, tantalum pentoxide, or a ferroelectric material.

Figure 8:
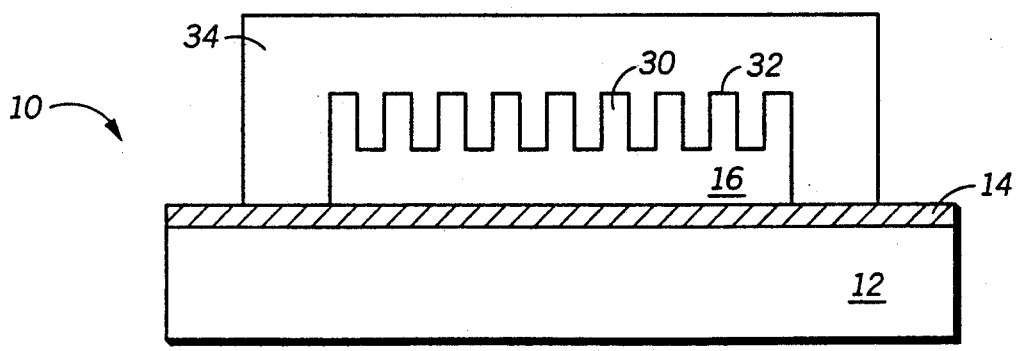

In FIG. 8, a second electrode layer is then formed overlying dielectric layer 32. Using standard photolithographic patterning and etching techniques the second electrode layer is then patterned to form an electrode 34. Electrode 34 is preferably chemical vapor deposited polysilicon. Alternatively, electrode 34 may also be another conductive material such as tungsten, amorphous silicon, et cetera. For EPROM, EEPROM, or Flash EEPROM applications electrode 34 serves as a control gate, while the underlying electrode layer 16, which has been patterned, serves as a floating gate. Analogously, for SRAM and DRAM applications, electrode 34 serves as a second electrode for a capacitor, while underlying electrode layer 16, which has been patterned, serves as the first electrode for the capacitor.

The foregoing description and illustrations contained herein demonstrate many of the advantages associated with the present invention. In particular, the formation of non-coalescing islands of material by sputter deposition is less dependent on deposition temperature, and on the morphology or cleanliness of the deposition surface. Therefore, island formation can be achieved over a wide range of processing conditions. As a result, electrode surfaces can be uniformly texturized. Moreover, semiconductor devices exhibiting uniform electrical and performance characteristics can be fabricated with this process.

Thus it is apparent that there has been provided, in accordance with the invention, a method for forming a semiconductor device having increased coupling capacitance that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, electrode layer 16 may also be patterned prior to forming the plurality of pillar-like regions 30, as opposed to being patterned after pillar-like regions 30 are formed. Furthermore, the second electrode layer, dielectric layer 32, and electrode layer 16 may also be patterned during the same process step in order to form a self-aligned stack. In addition, the invention is not limited to using non-coalescing islands 20 as a mask during the formation of pillar-like regions 30. It is envisioned that with the proper etch selectivity, non-coalescing islands 20 may be removed and remaining portion 26 of buffer layer 18 may be used as the hard mask during the formation of pillar-like regions 30. Moreover, it is also envisioned that with the proper etch selectivity and chemical compatibility non-coalescing islands 20 may be sputtered directly onto electrode layer 16 to form pillar-like regions 30. It is also important to note that the present invention is not limited in any way to any one non-volatile or volatile memory device. In addition, although non-coalescing islands 20 are shown in FIG. 3 to have a uniform spacing, they may be non-uniformly spaced apart from one another. Therefore, it is intended that this invention encompass all such variations and modifications as fall within the scope of the appended claims.

We claim:

1. A method for forming a semiconductor device comprising the steps of:
    providing a substrate;
    forming an electrode layer overlying the substrate;
    sputtering a plurality of non-coalescing islands of material overlying the electrode layer wherein the plurality of non-coalescing islands define a trench region;
    etching the trench region using the plurality of non-coalescing islands as a mask to form a plurality of pillar-like regions within the electrode layer; and
    removing the plurality of non-coalescing islands.

2. The method of claim 1 further comprising the step of patterning the electrode layer prior to forming the plurality of pillar-like regions within the electrode layer.

3. The method of claim 1 further comprising the step of patterning the electrode layer after forming the plurality of pillar-like regions within the electrode layer.

4. The method of claim 1 further comprising the steps of:
   forming a dielectric layer overlying the plurality of pillar-like regions within the electrode layer; and
   forming an electrode overlying the dielectric layer to form a capacitor.

5. The method of claim 1 wherein the step of sputtering a plurality of non-coalescing islands of material is further characterized as sputtering a material comprising aluminum.

6. The method of claim 1 further comprising the steps of:
   forming a dielectric layer overlying the plurality of pillar-like regions within the electrode layer; and
   forming a control gate overlying the dielectric layer.

7. The method of claim 1 wherein the step of forming an electrode layer is further characterized as depositing a polysilicon layer.

8. A method for forming a semiconductor device comprising the steps of:
   providing a substrate;
   forming an electrode layer overlying the substrate;
   forming a buffer layer overlying the electrode layer;
   sputtering a plurality of non-coalescing islands of material onto the buffer layer wherein the plurality of non-coalescing islands define an exposed portion of the buffer layer;
   etching the exposed portion of the buffer layer using the plurality of non-coalescing islands as an etch mask to form an exposed portion of the electrode layer and to form a remaining portion of the buffer layer;
   etching the exposed portion of the electrode layer to form a plurality of pillar-like regions within the electrode layer;
   removing the plurality of non-coalescing islands; and
   removing the remaining portion of the buffer layer.

9. The method of claim 8 further comprising the step of patterning the electrode layer prior to forming the plurality of pillar-like regions within the electrode layer.

10. The method of claim 8 further comprising the step of patterning the electrode layer after forming the plurality of pillar-like regions within the electrode layer.

11. The method of claim 8 further comprising the steps of:
    forming a dielectric layer overlying the plurality of pillar-like regions within the electrode layer; and
    forming an electrode overlying the dielectric layer to form a capacitor.

12. The method of claim 8 wherein the step of sputtering a plurality of non-coalescing islands of material is further characterized as sputtering a material comprising aluminum.

13. The method of claim 8 further comprising the steps of:
    forming a dielectric layer overlying the plurality of pillar-like regions within the electrode layer; and
    forming a control gate overlying the dielectric layer.

14. The method of claim 8 wherein the step of forming an electrode layer is further characterized as depositing a polysilicon layer.

15. A method for forming a semiconductor device comprising the steps of:
    providing a substrate;
    forming a polysilicon layer overlying the substrate;
    forming a buffer layer overlying the polysilicon layer;
    sputtering a granular aluminum film onto the buffer layer;
    etching the granular aluminum film to form a plurality of aluminum islands wherein the plurality of aluminum islands define an exposed portion of the buffer layer;
    etching the exposed portion of the buffer layer using the plurality of aluminum islands as an etch mask to form an exposed portion of the polysilicon layer and to form a remaining portion of the buffer layer;
    etching the exposed portion of the polysilicon layer to form a plurality of pillar-like regions within the polysilicon layer;
    removing the plurality of aluminum islands; and
    removing the remaining portion of the buffer layer.

16. The method of claim 15 further comprising the step of patterning the polysilicon layer prior to forming the plurality of pillar-like regions within the polysilicon layer.

17. The method of claim 15 further comprising the step of patterning the polysilicon layer after forming the plurality of pillar-like regions within the polysilicon layer.

18. The method of claim 15 further comprising the steps of:
    forming a dielectric layer overlying the plurality of pillar-like regions within the polysilicon layer; and
    forming an electrode overlying the dielectric layer to form a capacitor.

19. The method of claim 15 further comprising the steps of:
    forming a dielectric layer overlying the plurality of pillar-like regions within the polysilicon layer; and
    forming a control gate overlying the dielectric layer.

* * * * *